(12) United States Patent
Yeap et al.

(10) Patent No.: US 6,476,749 B1
(45) Date of Patent: Nov. 5, 2002

(54) HIGH SPEED ANALOG-TO-DIGITAL CONVERTER AND DIGITAL-TO-ANALOG CONVERTER

(75) Inventors: Tet Hin Yeap, Ottawa; Bharathi Ganesan, Nepean, both of (CA)

(73) Assignee: Bell Canada, Montreal (CA)

( * ) Notice: Subject to any disclaimer, the term of this patent is extended or adjusted under 35 U.S.C. 154(b) by 0 days.

(21) Appl. No.: 09/466,839

(22) Filed: Dec. 20, 1999

(30) Foreign Application Priority Data

Dec. 21, 1998 (CA) .............................................. 2256779

(51) Int. Cl.[7] .............................................. H03M 1/12
(52) U.S. Cl. ........................................ 341/155; 341/126
(58) Field of Search .................................. 341/141, 110, 341/116, 122, 129, 155, 117, 144, 145, 126, 156, 159, 161, 143; 375/119, 44

(56) References Cited

U.S. PATENT DOCUMENTS

| | | | | |
|---|---|---|---|---|
| 4,464,770 A | * | 8/1984 | Maurer et al. ............... | 375/119 |
| 4,890,107 A | * | 12/1989 | Pearce ......................... | 341/156 |
| 5,568,142 A | * | 10/1996 | Velazquez et al. .......... | 341/126 |
| 6,121,910 A | * | 9/2000 | Khoury et al. ............... | 341/143 |

OTHER PUBLICATIONS

*A 1–GHz 6–bit ADC System*, by Ken Poulton et al., IEEE Journal of Solid–State Circuits, vol. SC–22, No. 6 (Dec. 1987), pp. 962–970.

*High Speed A/D Conversion Using QMF Banks*, by Petraglia et al., Proceedings of IEEE International Symposium on Circuits and Systems (1990), pp. 2797–2800.

*Time Interleaved Converter Arrays*, by William C. Black, Jr., et al., IEEE Journal of Solid–State Circuits, vol. SC–15, No. 6 (Dec. 1980), pp. 1022–1029.

*Accuracy in Interleaved ADC System*, Allen Montijo and Kenneth Rush, Oct. 1993 Hewlett–Packard Journal.

*A Hydrid Filter Bank Approach to Analog–to–Digital Conversion*, Scott R. Velanzquez, Truong Q. Nguyen, Steven R. Broadstone, and James K. Roberge, MIT Lincoln Laboratory.

* cited by examiner

*Primary Examiner*—Brian Young
*Assistant Examiner*—John Nguyen
(74) *Attorney, Agent, or Firm*—Thomas Adams

(57) ABSTRACT

A high speed analog-to-digital converter, for converting an analog input signal (u(t)) with a maximum frequency ($F_{max}$) to a digital output signal (x(n)) with an output sampling rate ($F_s$) at least double the maximum frequency ($F_{max}$), comprises a plurality of analog narrowband filters ($F_0$–$F_{M-1}$) for filtering the analog input signal (u(t)) to produce a corresponding plurality of narrowband signals ($X_0$–$X_{M-1}$), which is supplied to a corresponding plurality of analog-to-digital converter units ($AD_0$–$AD_{M-1}$). The converter also comprises sampling and summing circuitry for sampling the outputs of the analog-to-digital converter units sequentially at the predetermined sampling rate (Fs) and summing the resulting sampled signals to produce the digital output signal (x(n)).

5 Claims, 10 Drawing Sheets

HIGH SPEED ANALOG-TO-DIGITAL CONVERTER AND DIGITAL-TO-ANALOG CONVERTER

BACKGROUND OF THE INVENTION

1. Technical Field

The invention relates to analog-to-digital and digital-to-analog converters, and is especially applicable to high speed analog-to-digital converters for wireless communications.

2. Background Art

High speed analog-to-digital converters and digital-to-analog converters are used in wireless telecommunications systems, where digital receivers are preferred, for high speed instruments, for example oscilloscopes, and for various other applications. Typically, an analog-to-digital converter comprises a clock-driven sample-and-hold circuit, which samples the analog signal at intervals and holds the sample values, and a quantizer which converts each quantized sample into a digital numerical representation. Typically, the quantizer will compare the ample value with a number of different voltage thresholds in order to determine the value of the sample to within a fairly small band and represent it digitally. It is desirable to provide high resolution as well as high speed, but these tend to be incompatible. Higher resolutions entail more comparisons, i.e. with a larger number of discrete voltage thresholds, which will increase the processing time required to perform the calculations.

One of the fastest A/D converters, known as the "Flash ADC", applies the sample value to a bank of comparators, each of which compares it with a different reference or threshold value. The outputs of the bank of comparators are applied to a Gray code decoder. Unfortunately, such Flash A/D converters require a ladder network of accurate resistors, preferably laser-trimmed, and so are expensive to produce. Consequently, most high speed devices presently available commercially have limited resolution are able to digitize a 500 MHz analog signal. Current applications, however, may require conversion of signals at 1 GHz and higher.

In order to convert higher frequency signals, it has been proposed to time-interleave two or more such high speed A/D converters. In a paper entitled "Time Interleaved Converter Arrays", IEEE Journal of Solid-State Circuits, Vol. SC-15, No. 6, December 1980, William C. Black, Jr., et al, disclosed a time interleaved A/D converter which used four sample-and-hold circuits and four quantizers and a multiplexer to obtain analog-to-digital conversion of an analog signal having a frequency four times that of the signal handled by each converter. In a paper entitled "A 1-GHz 6-bit ADC System", IEE Journal of Solid-State Circuits, Vol. SC-22, No. 6, December 1987, Ken Poulton et al disclosed a time-interleaved analog-to-digital converter capable of a sampling rate of one Gigasample per second using four sample-and-hold circuits and four quantizers. However, instead of a multiplexer, Poulton et al's converter used four memory banks read sequentially. In both cases, the time-interleaved converter arrays used offset clock signals for the four different sample-and-hold circuits. Black et al's multiplexer and Poulton et al's memory readout, however, operated at the speed of the system clock which was four times the speed of the individual sample-and-hold clock signals. Consequently, the sample-and-hold circuits operated at only one quarter of the overall sampling rate. A disadvantage of sitch time-interleaved converters is that phase jitter is produced because the offset clock signals are not precisely 90 degrees out of phase with each other, and errors arise because of variations in the high-speed clock which operates the multiplexer or memory readout. Also, the sample-and-hold circuits each see the full wideband signal, which places limitations on their capabilities.

The problem of obtaining both high speed and high resolution has been addressed by a number of people. In a paper entitled "High Speed A/D Conversion Using QMF Banks", Proceedings of IEEE International Symposium on Circuits and Systems (1990), Petraglia et al disclosed a technique for performing A/D conversion using quadrature mirror filter banks. Petraglia et al used an analysis filter bank which comprised a bank of switched capacitance filters and a bank of downsamplers. The downsampled subband signals were converted by a bank of A/D converter units and then applied to a synthesis filter bank which comprised a bank of upsamplers and a bank of digital filters. Although Petraglia et al's approach avoids the need for offset clock signals, and hence avoids the phase jitter problem, it is not entirely satisfactory because it uses switched capacitance filters. Discrete time-switched capacitance filters limit the speed and introduce switching noise, reducing signal-to-noise ratio. Reducing signal-to-noise ratio reduces resolution.

U.S. Pat. No. 5,568,142 issued Oct. 22, 1996 (Velazquez et al), disclosed an A/D converter using an analog analysis filter bank and a digital synthesis filter bank. The use of an analog (continuous time) analysis filter bank avoids the problems associated with discrete time switched capacitor filters. However, with present technology, it would be extremely difficult to achieve 1 Gigasample per second conversion rates with the analog-to-digital converter disclosed by Velazquez et al. In particular, Velazquez et al use several 64 tap digital filters in the synthesis filter bank. Hence, with a rate of 1 Gigasample per second, each digital filter would have to perform $65 \times 10^9$ multiplication operations per second and $64 \times 10^9$ addition operations per second. With current technology, this number of operations is not feasible.

SUMMARY OF THE INVENTION

The present invention seeks to eliminate, or at least mitigate, the disadvantages of these known analog-to-digital converters.

According to one aspect of the present invention, there is provided an analog-to-digital converter for converting an analog input signal ($u(t)$) having a frequency up to a predetermined maximum frequency ($F_{max}$) to a digital output signal ($x(n)$) having a predetermined output sampling rate ($F_s$) equal to at least double the maximum frequency ($F_{max}$), the analog-to-digital converter comprising a plurality of analog narrowband filters ($F_0$–$F_{M-1}$; $F_L, F_H, F_P$) for filtering the analog input signal ($u(t)$) to produce a corresponding plurality of narrowband signals ($X_0$–$X_{M-1}$; $X_L, X_H, X_P$), each narrowband filter having a passband, the sum of the gains of the narrowband filters at any frequency within the passbands of the plurality of narrowband filters being substantially unity, a corresponding plurality of sample-and-hold devices ($SH_0$–$SH_{M-1}$; $SH_L, SH_H, SH_P$) clocked by a plurality of clock signals ($\phi_0$–$\phi_{M-1}$; $\phi_1, \phi_2$), respectively, each of the plurality of clock signals having a frequency at least double the bandwidth of the corresponding narrowband filter, and a plurality of quantizers ($Q_0$–$Q_{M-1}$) each connected to a respective one of the sample-and-hold devices ($SH_0$–$SH_{M-1}$) and operable to provide a digitized value of each sample held by the corresponding sample-and-hold device, the converter further comprising sampling and summing means ($12, R_0-R_{M-1}$; $12_1, 12_2, 14$; $12, 14_1, 14_2$; $R_L, R_H, R_P$) for sampling and summing the outputs of the quantizers to produce said digital output signal (x(n)), the sampling being carried out sequentially at the predetermined sampling rate (Fs) in response to an output clock signal (CLK; $\phi_2$), the frequencies and phase-relationships of the plurality of clock signals ($\phi_0-\phi_{M-1}$; $\phi_1, \phi_2, \phi_3$) being such that each sample point of the output clock signal (CLK; $\phi_2$) coincides with a sample point of one of the plurality of clock signals ($\phi_0-\phi_{M-1}$; $\phi_1, \phi_2$; $\phi_1, \phi_2, \phi_3$)

In one preferred embodiment of the invention, the plurality of narrowband filters all have the same bandwidth equal to one half of the predetermined output sampling rate (Fs) divided by the number (M) of said narrowband signals, and the plurality of clock signals ($\phi_0-\phi_{M-1}$) all have the same frequency equal to the predetermined sampling rate ($F_s$) divided by the number (M) of narrowband signals and are phase-displaced relative to each other by one cycle of such same frequency divided by the number (M) of clock signals.

In an alternative embodiment, the plurality of analog narrowband filters have non-uniform bandwidths for filtering the analog input signal (u(t)) to produce a corresponding plurality of narrowband signals ($X_0-X_{M-1}$) having different bandwidths.

The sample-and-hold devices perform the downsampling function of the usual analysis filter bank. Consequently, providing the narrowband filters meet certain requirements, the plurality of narrowband filters and the plurality of sample-and-hold devices form an analysis filter bank. An important one of the requirements is that, at each frequency in the operating band, the sum of the squares of the magnitudes of the frequency response is equal to unity.

The foregoing and other objects, features, aspects and advantages of the present invention will become more apparent from the following detailed description, taken in conjunction with the accompanying drawings, of preferred embodiments of the invention, which are described by way of example only.

DESCRIPTION OF THE PREFERRED EMBODIMENT

Figure 1:
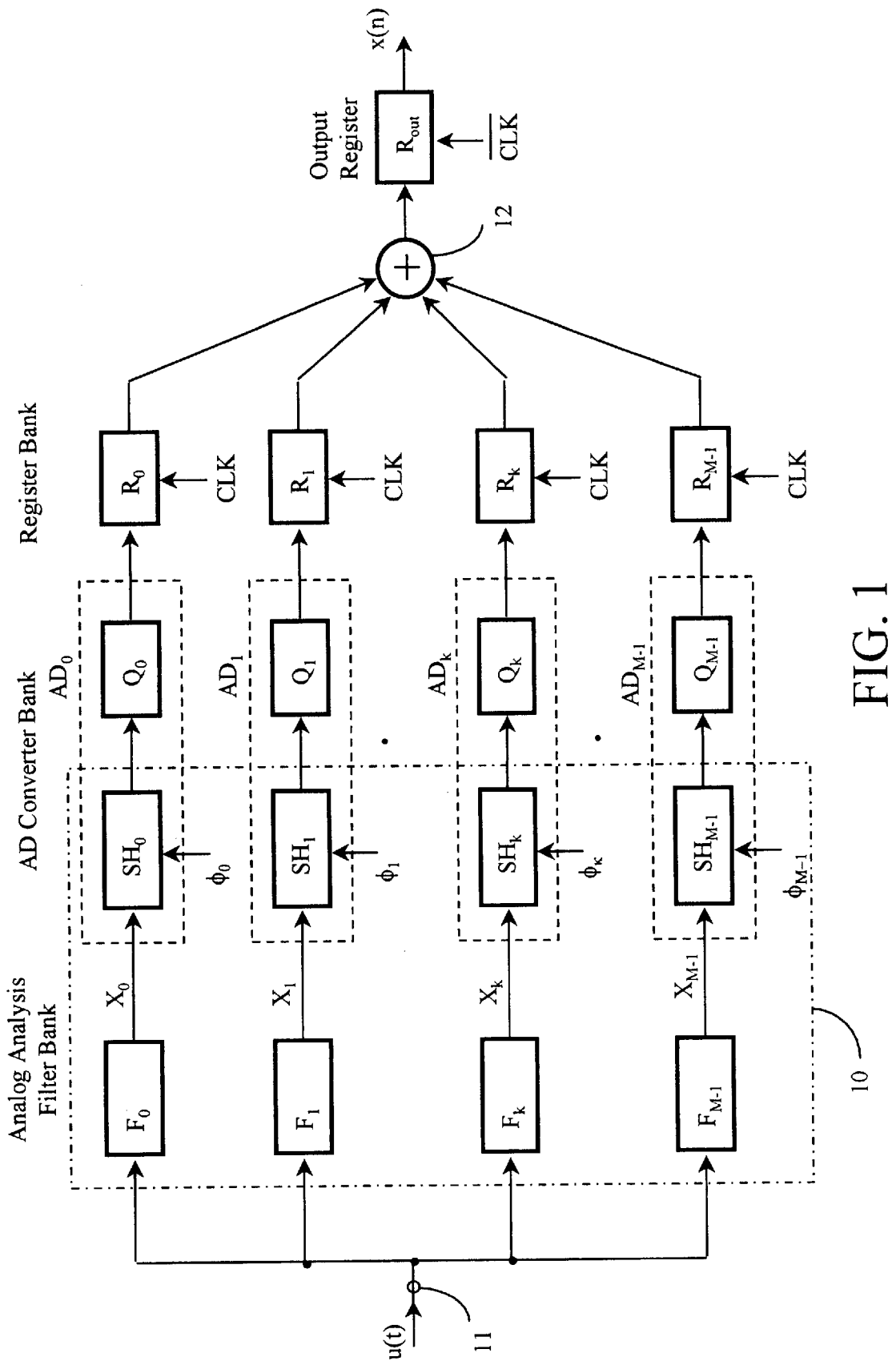
FIG. 1 is a block schematic representation of a generic M-band analog-to-digital converter according to one aspect of the invention.

Referring to FIG. 1, a high speed analog-to-digital converter for providing a digital output signal x(n) from an analog input signal u(t) comprises a bank of M narrowband analog filters $F_0$ to $F_{M-1}$, the input terminals of which are connected in common to an input terminal 11 to receive the analog input signal u(t). The maximum frequency of input signal u(t) is $F_{max}$. There is a certain degree of overlap between the frequency spectra of the analog filters $F_0$ to $F_{M-1}$, for reasons which will be explained in more detail later. The output terminals of the analog filters $F_0$ to $F_{M-1}$ are each connected to a corresponding one of the inputs of a plurality of sample-and-hold circuits $SH_0$ to $SH_{M-1}$, respectively, which have their output terminals connected to a corresponding plurality of quantizers $Q_0$ to $Q_{M-1}$, respectively, which convert each sample to a corresponding digitized value. Each combination of a sample-and-hold circuit and a quantizer itself constitutes an analog-to-digital converter. Consequently, the sample-and-hold circuits and associated quantizers comprise a bank of analog-to-digital converter units $AD_0$ to $AD_{M-1}$, which may be of known construction, for example as used in high speed oscilloscopes. The sample-and-hold circuits $SH_0$ to $SH_{M-1}$ are clocked by clock signals $\phi_0$ to $\phi_{M-1}$, respectively. The digitized values output from the quantizers $Q_0$ to $Q_{M-1}$ are buffered by a plurality of registers $R_0$ to $R_{M-1}$, respectively, each clocked by a master clock signal CLK having a frequency equal to a predetermined sample rate $F_s$ for the digital output signal x(n). A summing device 12 sums the buffered digitized values. The output from the summer 12 is passed through an output register $R_{out}$ which buffers the digital output signal x(n). The output register $R_{out}$ is clocked by a clock $\overline{CLK}$ which is the inverse of the master clock CLK. The clock signals $\phi_0$ to $\phi_{M-1}$ are derived from the master clock signal CLK so that each sampling edge of the master clock signal CLK coincides with a sampling edge of one of the plurality clock signals.

In order to meet Nyquist criteria, the output sample rate Fs is at least double the maximum input frequency $F_{max}$.

Providing the narrowband filters $F_0$ to $F_{M-1}$ meet requirements of unity gain mentioned above the bank of narrowband filters and the bank of sample-and-hold devices $SH_0$ to $SH_{M-1}$ form an analysis filter bank. Hence, when the narrowband signals $X_0$ to $X_{M-1}$, from analog filters $F_0$ to $F_{M-1}$ respectively, have been sampled by sample-and-hold circuits $SH_0$ to $SH_{M-1}$, they comprise subband signals.

The subband signals are low pass, band pass and high pass signals, each having its own spectral information, and each having a sample rate determined by the predetermined sample rate ($F_s$) of the output digital signal x(n) and the bandwidth of the corresponding filter relative to maximum input signal frequency $F_{max}$. For example, if maximum frequency $F_{max}$ is equal to 1 GHz, Fs is equal to 2 Gigasamples/second, and the filter bank comprises two equal filter which have the same bandwidth of 500 MHz., each of the sample-and-hold circuits will operate at 1 Gigasamples/second. Each sample-and-hold circuit would hold the sample value for two periods of the master clock signal CLK.

The mathematical input-output relationship of the M band embodiment of the invention shown in FIG. 1, and additional requirements which, preferably, are met by the narrowband filters, will now be described, for the case where the narrowband filter bank is uniform. In the time domain, signals are represented in lower case, e.g. u(t), x(n). In the frequency domain, upper case is used, e.g. $U(j\Omega)$, $X(e^{jw})$.

In the frequency domain, the result of filtering an input signal U(jΩ), band-limited to $\Omega_k$ rad/sec (k=0 ... M−1), through each of the analog narrowband filters $F_0$ to $F_{M-1}$ whose transfer function is $F_k(j\Omega)$ is $X_k(j\Omega)$ and is given by, $$X_k(j\Omega) = U(j\Omega) F_k(j\Omega) \tag{1}$$

Errors for each of the A/D converter units $AD_0$ to $AD_{M-1}$ are modelled as gain error $a_k$ and DC offset error $b_k$. Hence, in the time domain, the relationship between the output signal $d_k(n)$ of an ideal A/D converter unit AD and the corresponding narrowband signal $x_k(n)$ is given by:

$$d_k(n) = (1+a_k)x_k(n) + b_k \tag{2}$$

In the frequency domain, aliasing error will be seen along with the gain error and D.C. offset error. Hence, in the frequency domain, the output signal $D_k(e^{j\omega})$ from each of the A/D converter unit% $AD_0$ to $AD_{M\ 1}$ is given by the expression:

$$D_k(e^{j\omega}) = \frac{1+a_k}{T}\sum_{l=0}^{M-1} X_k\left(\frac{j\omega}{T} - \frac{j2\pi l}{T}\right) + b_k \sum_{l=0}^{M-1} 2\pi\delta(\omega - 2\pi l) \tag{3}$$

where δ is a delta function, T is the sampling period given by $$T = \frac{M\pi}{\Omega_k},$$

and the term $$X_k\left(\frac{j2\pi l}{T}\right)$$

is the aliasing error.

Substituting for $X_k(j\Omega)$ from equation (1) gives:

$$D_k(e^{j\omega}) = \frac{1+a_k}{T}\sum_{l=0}^{M-1} U\left(\frac{j\omega}{T} - \frac{j2\pi l}{T}\right) F_k\left(\frac{j\omega}{T} - \frac{j2\pi l}{T}\right) + b_k \sum_{l=0}^{M-1} 2\pi\delta(\omega - 2\pi l) \tag{4}$$

The wideband digital output signal $X(e^{j\omega})$ obtained by summing the signals $D_k(e^{j\omega})$ from the A/D) converter units $AD_0$ to $AD_{M-1}$ is given by:

$$X(e^{j\omega}) = \sum_{k=0}^{M-1} D_k(e^{j\omega}) \tag{5}$$

Combining equations (4) and (5) gives:

$$X(e^{j\omega}) = \sum_{k=0}^{M-1}\frac{1+a_k}{T}\sum_{l=0}^{M-1} U\left(\frac{j\omega}{T} - \frac{j2\pi l}{T}\right) F_K\left(\frac{j\omega}{T} - \frac{j2\pi l}{T}\right) + \sum_{k=0}^{M-1} b_k \sum_{l=0}^{M-1} 2\pi\delta(\omega - 2\pi l) \tag{6}$$

The summation terms in equation (6) can be rearranged and written as, $$X(e^{j\omega}) = \sum_{k=0}^{M-1} U\left(\frac{j\omega}{T} - \frac{j2\pi l}{T}\right) \cdot \left(\sum_{k=0}^{M-1}\frac{1+a_k}{T} F_k\left(\frac{j\omega}{T} - \frac{j2\pi l}{T}\right)\right) + \sum_{k=0}^{M-1} b_k \sum_{l=0}^{M-1} 2\pi\delta(\omega - 2\pi l) \tag{7}$$

Equation (7) can be simplified by substituting functions $A_p(e^{jw})$ and β, to give:

$$X(e^{j\omega}) = \sum_{p=0}^{M-1} U\left(\frac{j\omega}{T} - \frac{j2\pi p}{T}\right) A - p(e^{j\omega}) + \beta \tag{8}$$

where $A_p(e^{jw})$ is the aliasing function for the whole high speed A/D converter and is given by the expression:

$$A_p(e^{j\omega}) = \sum_{k=0}^{M-1}\frac{1+a_k}{T} F_k\left(\frac{j\omega}{T} - \frac{j2\pi p}{T}\right), p = 0...M-1 \tag{9}$$

and the total DC offset error β for the whole high-speed A/D converter is given by the expression:

$$\beta = 2\pi \sum_{k=0}^{M-1} b_k \sum_{p=0}^{M-1} \delta(\omega M - 2\pi p) \tag{10}$$

The condition for avoiding aliasing is:

$$A_o(e^{jw}) = e^{jwd}\ p=0 \tag{11}$$

$$A_p(e^{jw}) = 0\ p=1\ldots(M-1) \tag{12}$$

where d is the overall system delay, i.e. for the whole high-speed A/D converter. The condition for zero D.C. offset error is:

β=0

In order for the digital output signal x(n) to be a so-called perfect or pseudo-perfect representation of the input signal u(n), the analysis filter bank formed by the analog filters $F_0$ to $F_{M-1}$ and sample-and-hold circuits $SH_0$ to $SH_{M-1}$ should be designed so that, at any frequency within the operating range, zero to $F_{max}$, the gains of the filters sum to unity, i.e. $|F_0(j\Omega)|^2 + |F_1(j\Omega)|^2 + \ldots + |F_{M-1}(j\Omega)|^2 = 1$ This is analogous to the output of an analysis filter bank being capable of perfect or pseudo-perfect reconstruction using a corresponding synthesis filter bank.

The frequencies and relative phase-displacements of the clock signals $\phi_0$ to $\phi_{M-1}$ are selected so that every sample point of the output signal corresponds to a sample point of one of the clock signals $\phi_0$ to $\phi_{M-1}$. Where the analog filters $F_0$–$F_{M-1}$ have the same bandwidth, the clock signals have the same frequency and are phase-shifted uniformly relative to each other by 2π/M radians so as to subdivide each clock period of the input signal u(t) into M equal segments. Hence, for a two-band A-to-D converter, there would be two sample-and-hold circuits clocked by two clock signals 180° out of phase with each other, the data being stored on the rising edges of each of the clock signals. For a four-band converter, the clock signals would be phased at 90° increments relative to each other.

The implementation and operation of a two-band high speed analog-to-digital converter will now be described with reference to FIGS. 2 and 3.

Figure 2:
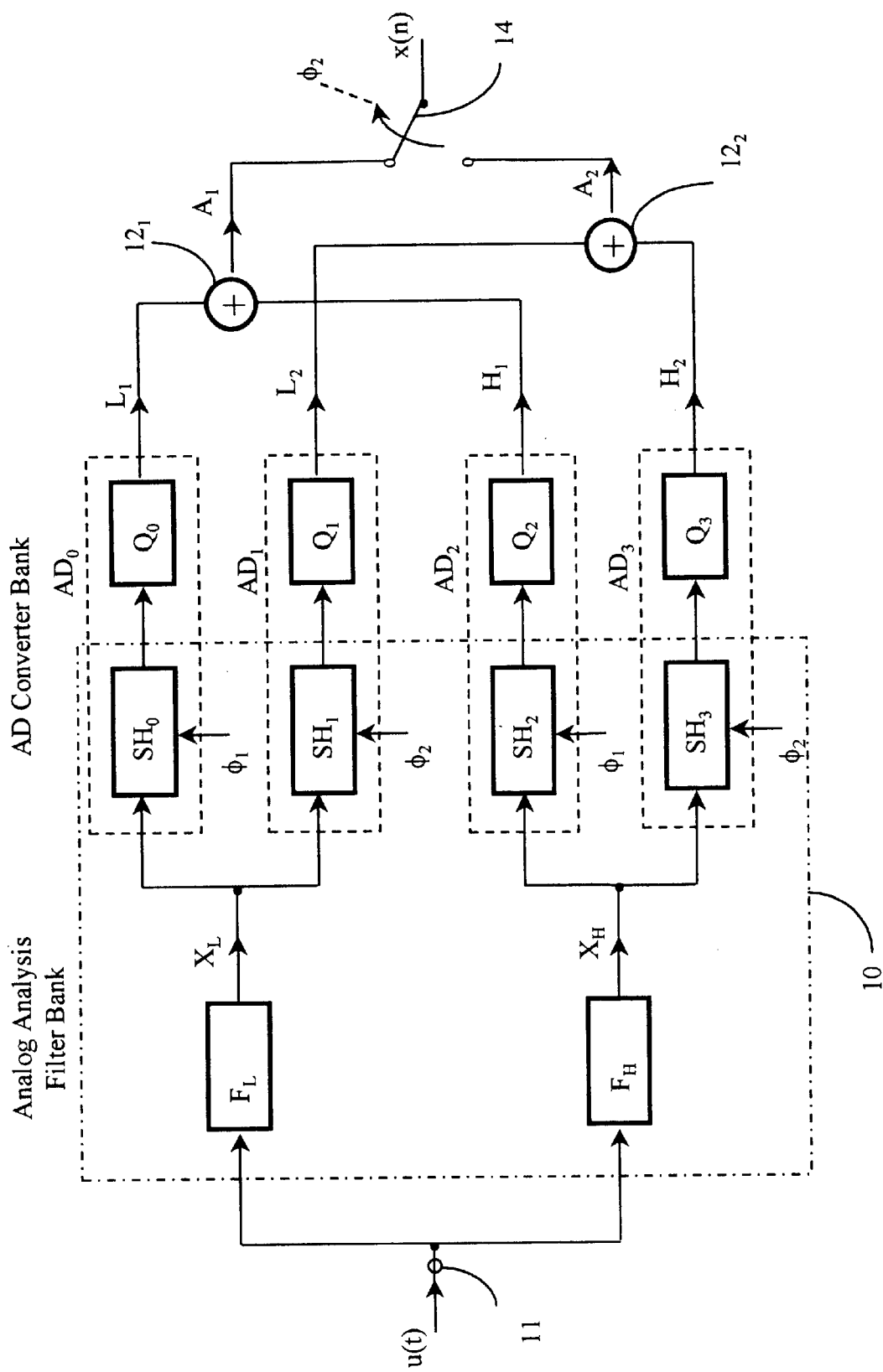
FIG. 2 is a block schematic diagram of a two-band uniform resolution analog-to-digital converter embodying the invention.
Figure 3:
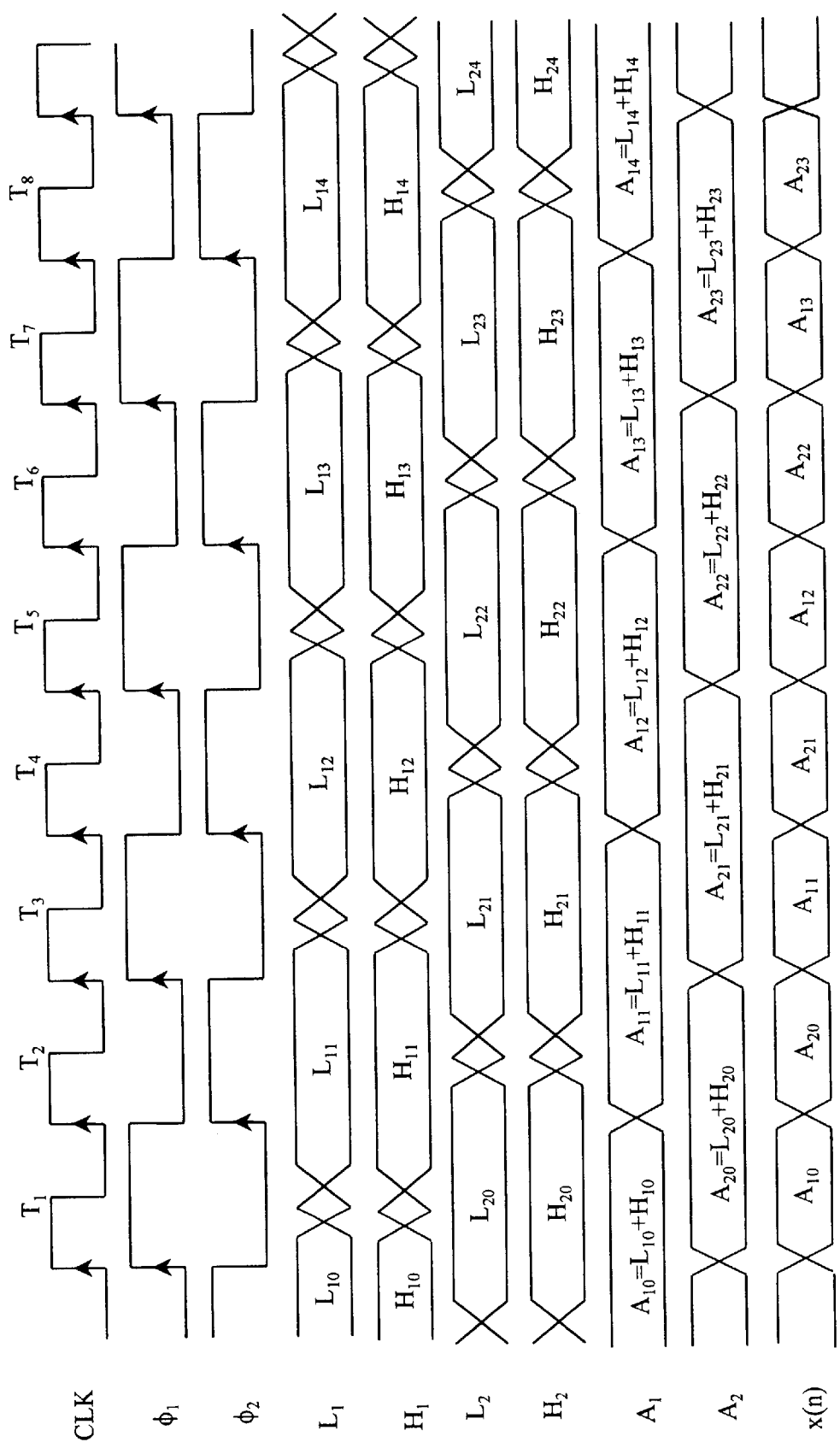
FIG. 3 is a timing diagram for the analog-to-digital converter of FIG. 2.

Referring to FIG. 2, the high speed analog-to-digital converter comprises a high-pass filter PH and a low-pass filter $F_1$ with their inputs connected in common to an input terminal 11 to receive the input signal u(t) to be digitized. The narrowband signal $X_H$ from the high-pass filter $F_H$ is applied to the respective inputs of a pair of sample-and-hold circuits $SH_0$ and $SH_1$ which are clocked by clock signals $\phi_1$ and $\phi_2$, respectively, which are in antiphase relative to each other so that the sample-and-hold circuits $SH_0$ and $SH_1$ operate in time-interleaved manner. The samples from the sample-and-hold circuits $SH_0$ and $SH_1$ are applied to quantizers $Q_0$ and $Q_1$ respectively. In a similar manner, the narrowband signal $X_L$ from lowpass filter $F_L$ is applied to the inputs of a second pair of sample-and-hold circuits $SH_2$ and $SH_3$ which also are clocked by clock signals $\phi_1$ and $\phi_2$, respectively. The samples from sample-and-hold circuits $SH_2$ and $SH_3$ are applied to quantizers $Q_2$ and $Q_3$, respectively.

The quantized values $L_1$ and $H_1$ from quantizers $Q_0$ and $Q_1$, respectively, are summed by a first summing device $12_1$, and the quantized values $L_2$ and $H_2$ from quantizers $Q_1$ and $Q_2$, respectively, are summed by summing device $12_2$. A switching device 14, conveniently a time multiplexer, clocked by clock signal $\phi_2$, which here serves also as the output clock signal, selects the outputs of summers $12_1$, and $12_2$, alternately, for output as digitized output signal x(n). The switching device 14 is clocked so that, when clock signal $\phi_2$ is high, the output of summer $12_2$ is selected. Conversely, when the clock signal $\phi_2$ is low, clock signal $\phi_1$ is high and the output is taken from summer $12_1$. Hence, the digitized values in summers $12_1$ and $12_2$ are sampled on both the rising and falling edges of clock signal $\phi_2$, which is equivalent to sampling on the rising edges of main clock signal CLK.

Operation of the two-band analog-to-digital converter of FIG. 2 will now be described with reference to the timing diagram in FIG. 3. For reference purposes, successive periods of the main clock signal CLK are numbered as $T_1$ to $T_8$. Clock signals $\phi_1$ and $\phi_2$ are derived from a master clock signal ClK, specifically by dividing it by two.

At the beginning of period $T_1$ of clock signal CLK a leading edge of clock signal $\phi_1$ causes the sample-and-hold circuits $SH_0$ and $SH_1$, to sample signals $X_L$ and $X_H$. The resulting samples, respectively, immediately are quantized to produce values $L_{11}$ and $H_{11}$ which are summed by summing device 12, to produce value $A_{11}$. As can be seen from FIG. 3, there will be some delay due to the time taken for quantization and also for summing.

At the beginning of interval T2 of main clock CLK, clock signal $\phi_2$ causes sample-and-hold circuits $SH_1$ and $SH_3$ to sample signals $X_L$ and $X_H$. The resulting samples are quantized to produce quantized values $L_{21}$ and $H_{21}$ which are summed by summer $12_2$ to produce value $A_{21}$.

The process is repeated to produce two series of values of $A_1$ and $A_2$ at the poles of switching device 14, vis. $A_{10}$, $A_{11}$, $A_{12}$, $A_{13}$ and so on at one pole and $A_{20}$, $A_{21}$, $A_{22}$, $A_{23}$, and so on at the other pole.

The switching device 14 selects the values alternately at the frequency of main clock signal CLK. Thus, when clock signal $\phi_2$ is low, and clock signal $\phi_1$ is high, values of $A_1$ are selected. When clock signal $\phi_2$ is low and clock signal $\phi_1$ is low, values of $A_2$ are selected.

Typically, for example, for an input u(t) having a maximum frequency of 1 gigahertz, the filters $F_L$ and $F_H$ would be 0–500 MHz and 500–1000 MHz, respectively. Each of the sample-and-hold circuits; $SH_0$–$SH_3$ will sample at a rate of 1 gigasample per second. The output signal rate will be at least 2 gigasamples per second.

Each A/D converter unit samples at one half of the output rate $F_s$, but each narrowband subband signal is sampled by two sample-and-hold converter units, offset by 180°, so that the effective sampling is at the full output rate.

The analog-to-digital converter of FIG. 2 is capable of high accuracy and high speeds without the usual problems associated with time-interleaving. In particular, because the sampled signals $X_L$ and $X_H$ are narrowband signals, the dynamic response requirements for the sample-and-hold circuits $SH_0$–$SH_3$ is reduced.

Figure 4:
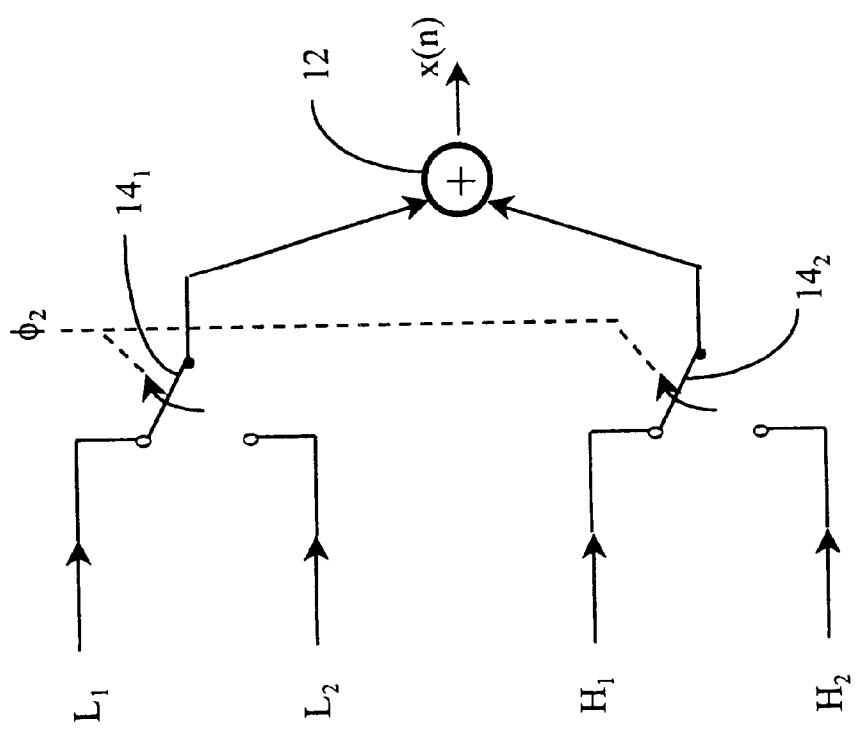
FIG. 4 is a detail diagram illustrating a modification to the output portion of the analog-to-digital converter of FIG. 2.

As illustrated in FIG. 4, it would be possible to modify the output portion of the analog-to-digital converter of FIG. 2 so as to avoid the use of two summers $12_1$ and $12_2$. Thus, in FIG. 4 the outputs $L_1$ and $L_2$ from quantizers $Q_0$ and $Q_1$ are supplied to a switching device $14_1$, for example a multiplexer, while the output $H_1$ and $H_2$ from the quantizers $Q_2$ and $Q_3$ are supplied to a second switching device $14_2$, for example another multiplexer. The switching devices $14_1$ and $14_2$ are clocked by clock signal $\phi_2$, as before. The outputs of the switching devices $14_1$ and $14_2$ are summed by summing device 12 to provide the digitized output signal x(n). With this arrangement, only one summer 12 is needed, but it must be capable of operation at double the rate of summers $12_1$, and $12_2$ of FIG. 2.

Figure 5:
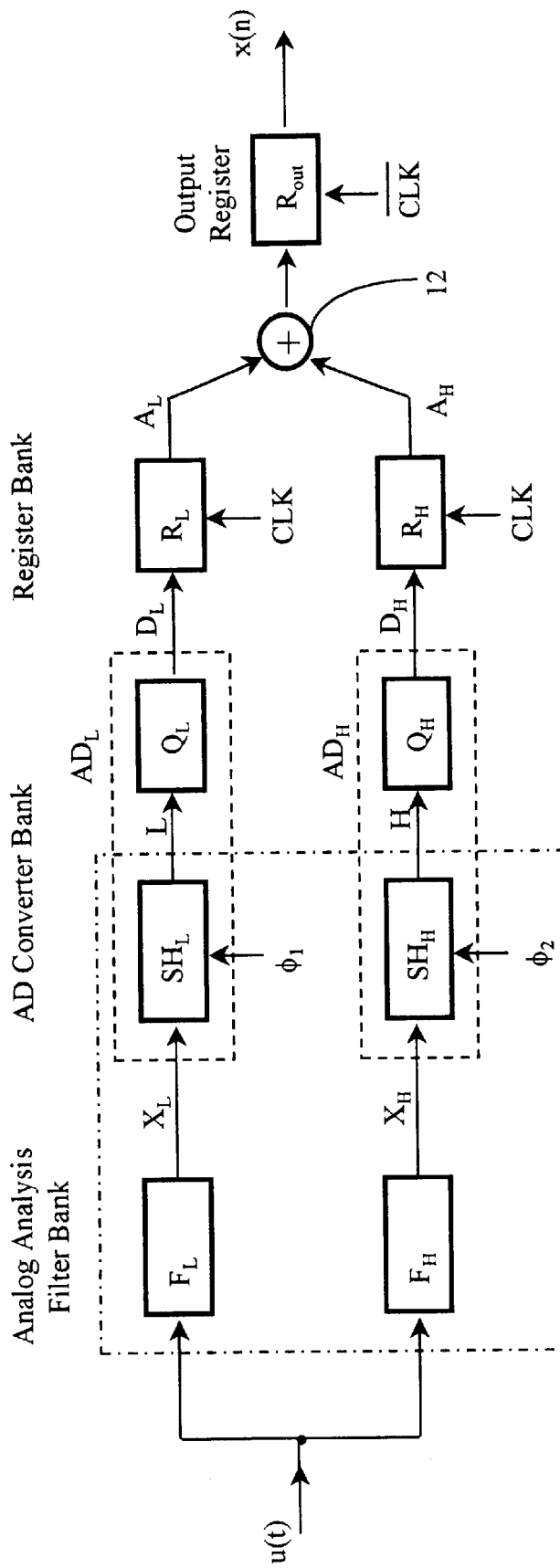
FIG. 5 is a block schematic representation of a second two-band uniform resolution analog-to-digital converter embodying the invention.

Although the analog-to-digital converters of FIGS. 2 and 4 produce very accurate results, acceptable accuracy for many applications can he obtained with fewer sample-and-hold circuits, as illustrated in FIG. 5. Thus, in the analog-to-digital converter shown in FIG. 5, high pass filter $F_H$ and low pass filter $F_L$ have their inputs connected in common to the input terminal to receive the analog signal u(t). The narrowband signals $X_H$ and $X_L$ from high pass filter $F_H$ and low-pass filter $F_L$, respectively, are applied to sample-and-hold circuits $SH_H$ and $SH_L$, respectively. The sample-and-hold circuits $SH_H$ and $SH_L$ are clocked by clock signals $\phi_1$ and $\phi_2$, respectively. As in the embodiments of FIGS. 2 and 4, the clock signals $\phi_1$ and $\phi_2$ are at one half the sampling rate Fs of the output signal and in anti-phase relative to each other. Hence, the sample-and-hold circuits $SH_L$ to $SH_H$ perform downsampling, so the high-pass filter $F_H$, the low-pass filter $F_L$, and the two sample-and-hold circuits $SH_H$ and $SH_L$ effectively form an analysis filter bank having the "perfect reconstruction/representation" or "pseudo-perfect reproduction/representation" capabilities previously discussed. The samples from sample-and-hold circuits $SH_H$ and $SH_L$ are digitized by quantizers $Q_H$ and $Q_L$, respectively, to provide digitized values $D_H$ and $D_L$, respectively. The series of values $D_H$ and $D_L$ from the quantizers $Q_L$ and $Q_H$ are buffered by registers $R_L$ and $R_H$ clocked by main clock signal CLK. The buffered digital signals $A_H$ and $A_L$ are summed by summing device 12, the output of which is buffered by an output register $R_{out}$, clocked by clock signal $\overline{CLR}$, i.e. the inverse of master clock signal CLK, before being output as the digital representation x(n) of the analog input signal u(t).

Operation of the two-band high speed analog-to-digital converter of FIG. 5 will now be described with reference to FIG. 6 which depicts the timing diagrams for the device.

Figure 6:
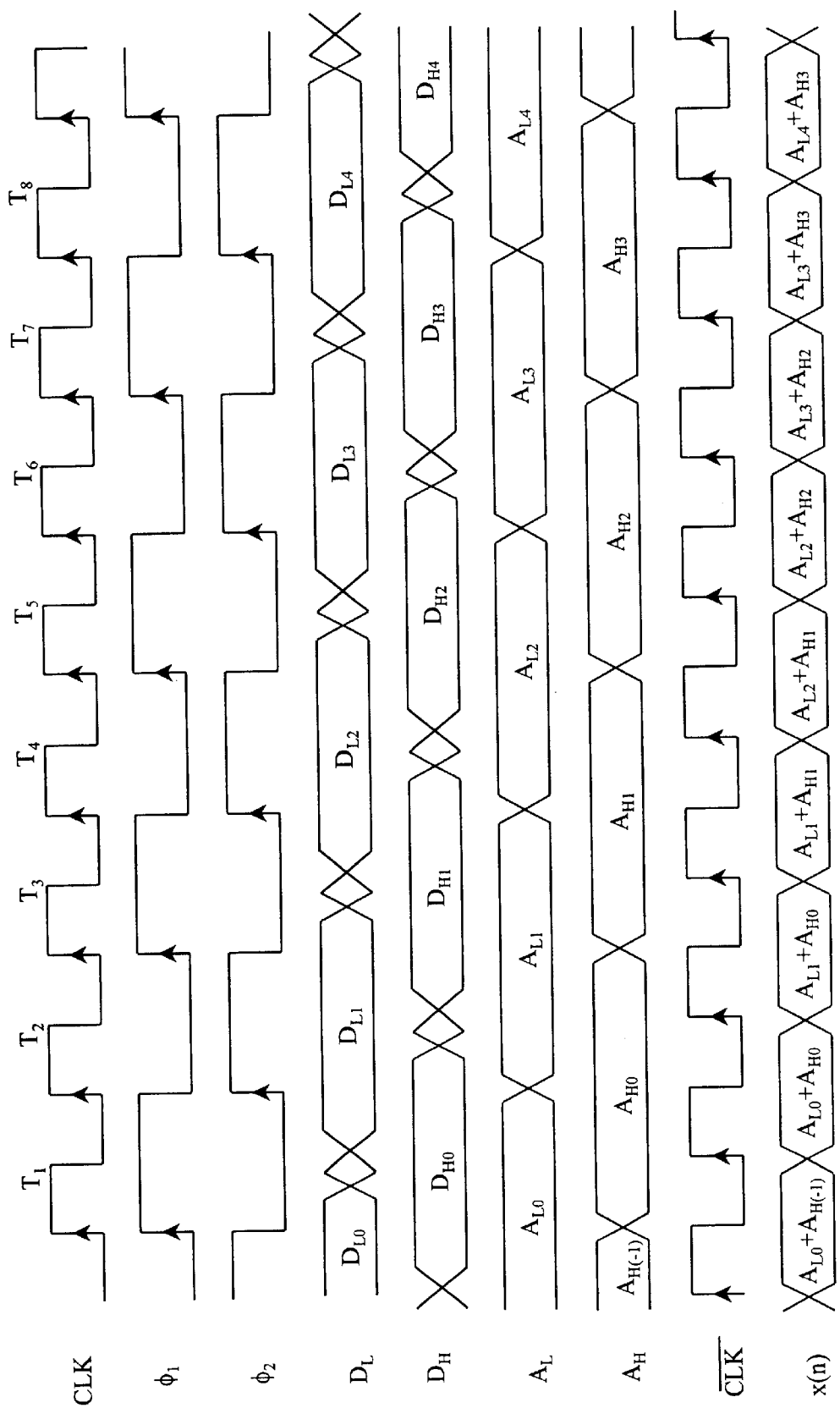
FIG. 6 is a timing diagram for the analog-to-digital converter of FIG. 5.

For reference purposes, successive cycles of the main clock CLK which are shown in FIG. 6 are numbered $T_1$ through $T_8$, inclusive. At the beginning of first period $T_1$, the rising edge of clock signal $\phi_1$ causes the sample-and-hold circuit $SH_L$ to sample the low-pass narrowband signal $X_L$ to produce, and hold, a first sample $L_1$. Quantizer $Q_L$ in analog-to-digital converter unit $AD_L$ quantizes the sample $L_1$ to produce a corresponding digital representation $D_{L1}$. The sampling and quantizing take a certain amount of time, which is much less than one period of clock signal $\phi_1$. On the following rising edge of main clock CLK, i.e. at the beginning of period $T_2$, the digital value $D_{L1}$ is clocked into the register $R_L$ which stores it as value $AL_1$ during periods $T_2$ and $T_3$ of main clock signal CLK, since the value $D_{L1}$ persists at the output of analog-to-digital converter unit $AD_L$ when the register $R_L$ is clocked again at the beginning of period $T_3$.

The high pass narrowband signal $X_H$ is digitized in a similar manner. During the first period $T_1$ of main clock signal CLK, clock signal $\phi_2$ is low. On the rising edge of clock signal $\phi_2$ at the end of first clock period $T_1$, clock signal $\phi_2$ causes the sample-and-hold circuit $SH_H$ in analog-to-digital converter unit $AD_H$ to sample the narrowband signal $X_H$ to acquire and hold sample $H_1$. Quantizer $Q_H$ quantizes the sample value $H_1$ to produce a corresponding digital value $D_{H1}$ and, on the next rising edge of clock signal CLK (start of period $T_3$), transfers the value $D_{H1}$ into register $R_H$ which stores it as value $A_{H1}$, for two periods of clock signal CLK.

The summing device 12 sums the instant values of $A_H$ and $A_L$ continuously and supplies the sum to register $R_{out}$ which outputs the value on each falling edge of clock CLK (i.e. rising edge of inverse clock $\overline{CLK}$).

Hence, on the falling edge of main clock CLK occurring in period $T_3$, register $R_{out}$ outputs the value $A_{L1}+A_{H1}$ as the digital representation of the current sample of input signal u(t). While this processing of samples $H_1$ and $L_1$ is taking place, the process of sampling and quantizing is already being repeated for the next pair of samples. Thus, on the rising edge of clock signal $\phi_1$ at the start of period $T_3$, analog-to-digital converter unit $AD_L$ acquires a second sample $L_2$ and quantizes it to produce a corresponding digital representation $D_{L2}$, which is stored in register $R_L$.

Likewise, the rising edge of clock signal $\phi_2$ at the start of period $T_4$ causes the sample-and-hold circuit $SH_H$ in analog-to-digital converter unit $AD_H$ to obtain and hold sample $H_2$ which is quantized and stored in register $R_H$. On the next falling edge of main clock signal CLK, the register $R_{out}$ outputs the sum $A_{L2}+A_{H2}$. The sequence is repeated for subsequent samples.

It can be seen from FIG. 6 that the values in the registers $R_H$ and $R_L$ are each stored for two cycles of the main clock signal CLK. However, the contents of the registers $R_H$ and $R_L$ do not change at the same time, but rather at times which are separated by one clock period of main clock signal CLK. Consequently, the stored values overlap. Because register $R_{out}$ is clocked at the rate of main clock signal CLK, it samples the sum of the two overlapped signals $A_H$ and $A_L$ once each clock period.

Providing the analysis filter bank 10 meets the conditions set out hereinbefore, the digital signal x(n) outputted from register $R_{out}$ will be a "perfect or pseudo-perfect representation" of the analog input signal u(t).

If the input signal is a wideband signal having a bandwidth, say, of 500 MHz, the main clock signal CLK must have a minimum frequency of 1 GHz to meet Nyquist criteria.

It will be seen from FIGS. 5 and 6, that the analog-to-digital converter units $AD_H$ and $AD_L$ sample the narrowband signals at a rate which is one half of the output sample rate Fs. For example, for an input signal having a bandwidth of 500 MHz, and an output signal x(n) having a sampling rate Fs of 1 Gigasample/sec, each of the analog-to-digital converter units $AD_H$ and $AD_L$ samples at a rate of only 500 Megasamples/sec.

Each output sample value is alternately a value which was obtained within the previous half cycle of the main clock CLK and a value which was obtained approximately one cycle previously. At any given time, therefore, the output from a particular one of the A–D converter units ADH and ADL will be current or delayed. Because the signals supplied to the quantizers $Q_H$ and $Q_L$ are, in effect, subband signals, and the analysis filter bank characteristics are carefully selected to ensure correlation between these subband signals, in particular in accordance with the principles of "perfect or pseudo-perfect reconstruction", the output signal x(n) is an accurate representation of the analog input signal u(t).

It should be noted that the high speed analog-to-digital converter uses what, in effect, is an analysis filter bank to divide the input signal into subband signals, but does not use the usual synthesis filter bank to recombine them. It should also be noted that an analysis filter bank comprises a set of narrowband filters followed by a set of downsamplers. In this case, the sample-and-hold units $SH_L$ and $SH_H$ provide the downsampling because each samples at one half of the rate of the output signal, and at least double the bandwidth of the corresponding one of narrowband filters $F_L$ and $F_H$.

The analog-to-digital converter units $AD_H$ and $AD_L$ do not operate directly upon the input signal but rather upon the narrowband signals. Consequently, the need for wideband analog-to-digital converter units is avoided. Because the analog-to-digital converter units operate with a narrow bandwidth, they are less susceptible to phase errors. For an input signal u(t) having a maximum frequency of, say, 500 MHz, and two narrowband filters $F_L$ and $F_H$ of equal bandwidth, each analog-to-digital converter unit would handle only 250 MHz bandwidth. Consequently, since each analog-to-digital converter unit is still clocked at 500 samples per second, it oversamples the narrowband signal and so is less affected by phase error. It should also be noted that, because the outputs from the two A–D converter units $AD_L$ and $AD_H$ are added, differences between the two A-to-D converter units would offset each other, making the device less susceptible to gain error.

An advantage of the embodiment of FIG. 5 is that it requires only two A–D converter units $AD_L$ and $AD_H$ to produce a satisfactory output suitable for use in most wireless telecommunications applications, and the like. if even greater accuracy is desired, however, such as for instrumentation applications, and the expense of additional analog-to-digital converter units can be tolerated, the analog-to-digital converters of FIGS. 2 and 4 might be preferred. The embodiments of FIGS. 2 and 4 potentially are more accurate than that of FIG. 5 because they do not rely upon correlation between the instant and previous values of the two narrowband signals $X_H$ and $X_L$. Rather, each narrowband signal is sampled at the full output rate.

Figure 7:
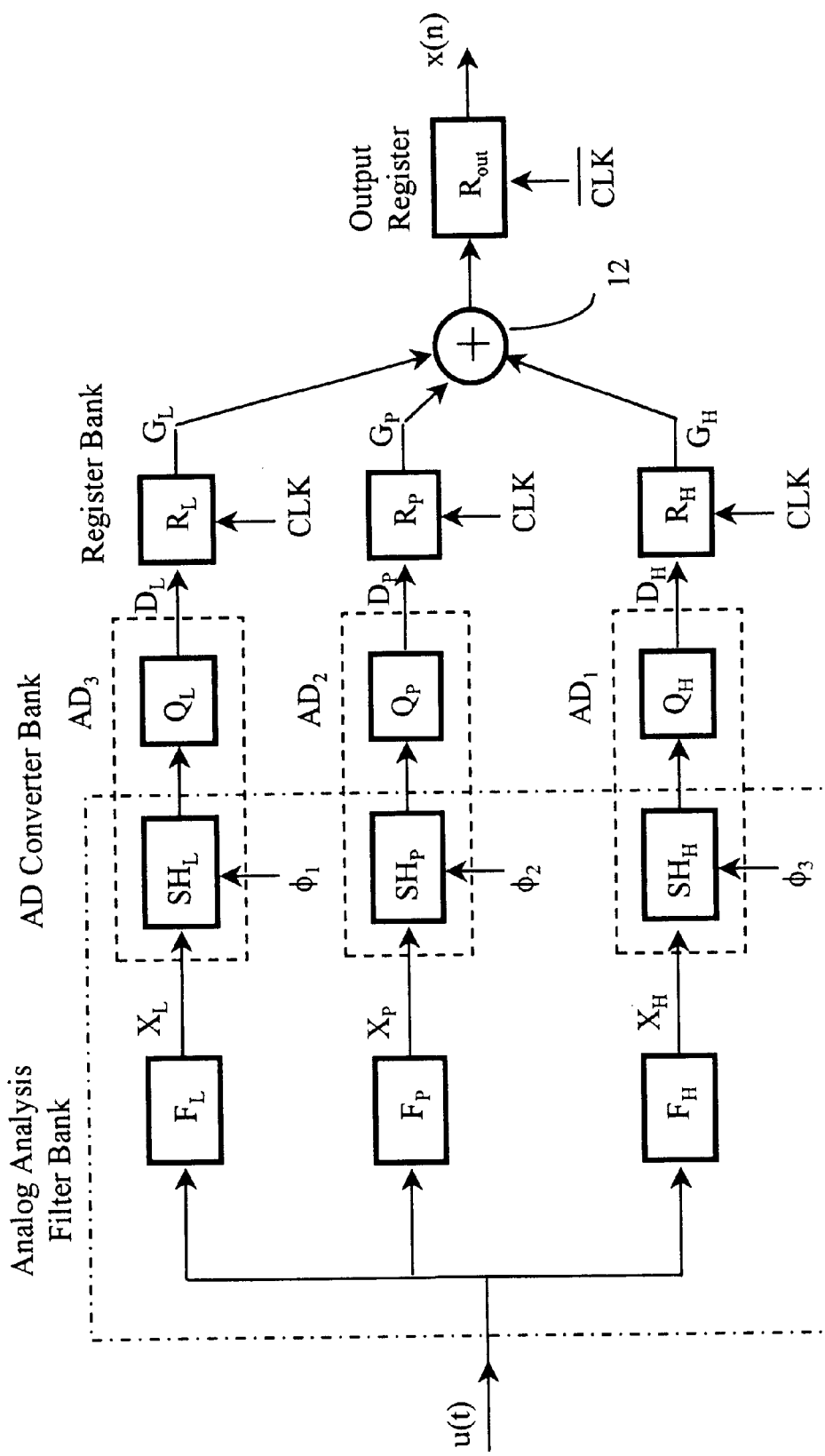
FIG. 7 is a block schematic representation of a multi-resolution analog-to-digital converter embodying the invention.

There are applications where a multi-resolution A/D converter would be desirable. Such a multi-resolution A/D converter is illustrated in FIG. 7. The analog input signal u(t) having a frequency up to a maximum $F_{max}$ is supplied in common to the inputs of a bank of narrowband filters comprising a low pass filter $F_L$, a bandpass filter $F_P$ and a high pass filter $F_H$, all having different bandwidths. For example, the bandwidths might be 0–250 MHz, 250–500 MHz and 500 MHz to 1 GHz, respectively. The narrowband signals $X_L$, $X_P$, and $X_H$ from the filters $F_L$, $F_P$ and $F_H$ are supplied to three sample-and-hold circuits $SH_L$, $SH_P$ and $SH_H$, respectively. The samples from the sample-and-hold circuits $SH_L$, $SH_P$ and $SH_H$ are quantized by quantizers $Q_L$, $Q_P$ and $Q_H$, respectively, to provide digitized samples $D_L$, $D_P$ and $D_H$ which are clocked into registers $R_L$, $R_P$ and $R_H$, respectively. The outputs of the registers are connected to respective inputs of a summing device 12 which sums the outputs $G_L$, $G_P$ and $G_H$ from the registers $R_L$, $R_P$ and $R_H$ and supplies the sum to output register $R_{out}$, which acts as a buffer. Registers $R_L$, $R_P$ and $R_H$ are clocked by main clock signal CLK at the predetermined sampling rate $F_S$ while output register $R_{out}$ is clocked by the inverse clock signal $\overline{CLK}$, i.e. on the falling edges of main clock signal CLK.

The frequencies of clock signals $\phi_1$, $\phi_2$ and $\phi_3$, and their relative phases, are selected so that each sampling point/edge of the main clock signal CLK substantially coincides with one of the sampling points/edges of the clock signals $\phi_1$, $\phi_2$, and $\phi_3$. For example, if $F_{max}$ is 1 GHz, the bandwidths of filters $F_L$, $F_P$ and $F_H$ are 0–250 MHz, 250–500 MHz and 500 MHz–1 GHz, respectively, and the output sample rate $F_s$ is equal to at least 2 Gigasamples/second, suitable frequencies for clock signals $\phi_1$, $\phi_2$, and $\phi_3$ are 500 MHz, 500 MHz and 1 GHz, respectively.

Again, the filters $F_L$, $F_P$ and $F_H$, together with the sample-and-hold circuits $SH_L$, $SH_P$ and $SH_H$, constitute an analysis filter bank. Also, each combination of a sample-and-hold circuit and a quantizer constitutes an analog-to-digital converter unit.

Figure 9:
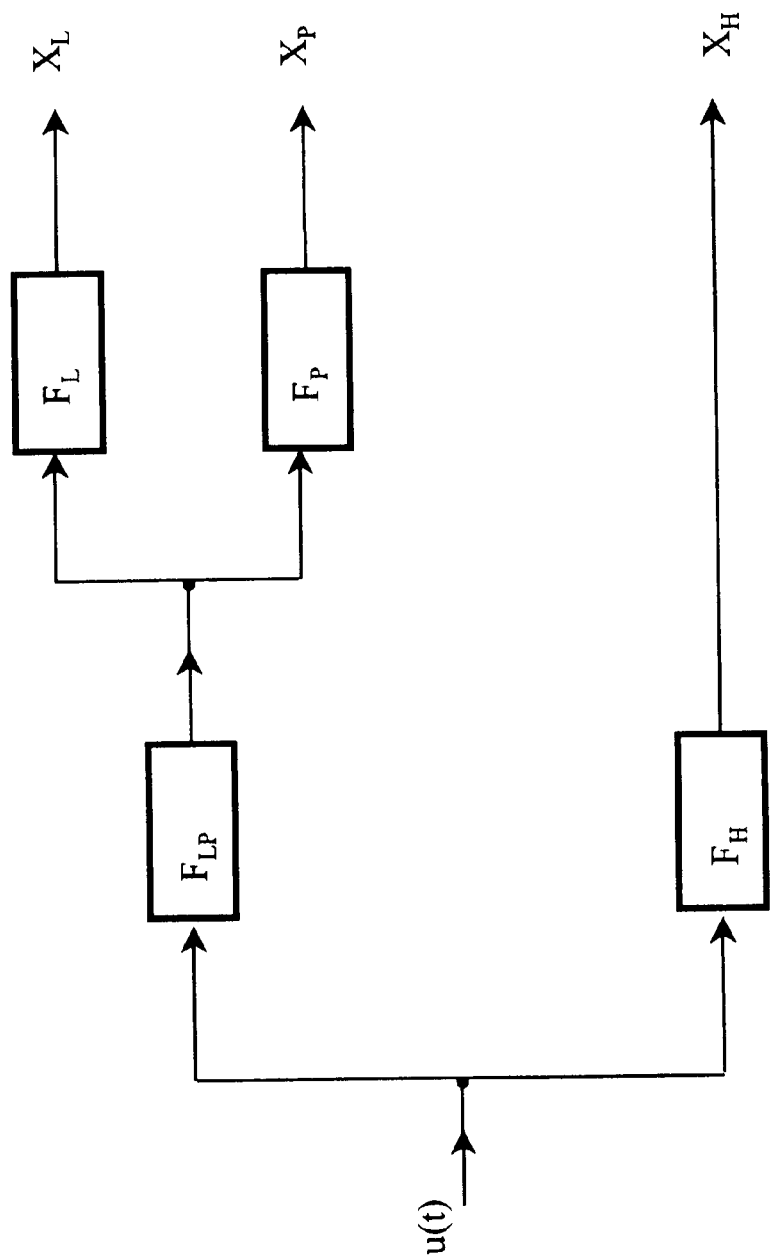
FIG. 9 illustrates an octave band filter bank suitable for use in the analog-to-digital converter of FIG. 8.

The filters $X_L$, $X_P$ and $X_H$, could comprise an octave filter bank as shown in FIG. 9. The octave filter bank comprises a first stage formed by a lowpass filter $F_{LP}$ and a high pass filter $F_H$ having their inputs connected in common to receive the input signal u(t). The narrowband signal from filter $F_H$ is the high pass signal $X_H$. The filtered signal from filter $F_{LP}$ is filtered by additional two filters $F_L$ and $F_P$ to provide the low pass signal $X_L$ and the bandpass signal $X_P$. Filters $F_{LP}$ and $F_H$ would have the same bandwidth, e.g. 500 MHz, and filters $F_L$ and $F_P$ would have the same, lower bandwidth, e.g. 250 MHz.

The frequency of clock signal $\phi_3$ is one half of the rate of master clock signal CLK, and the clock signals $\phi_2$ and $\phi_1$ have the same frequency equal to one half the rate of clock signal $\phi_3$.

Figure 8:
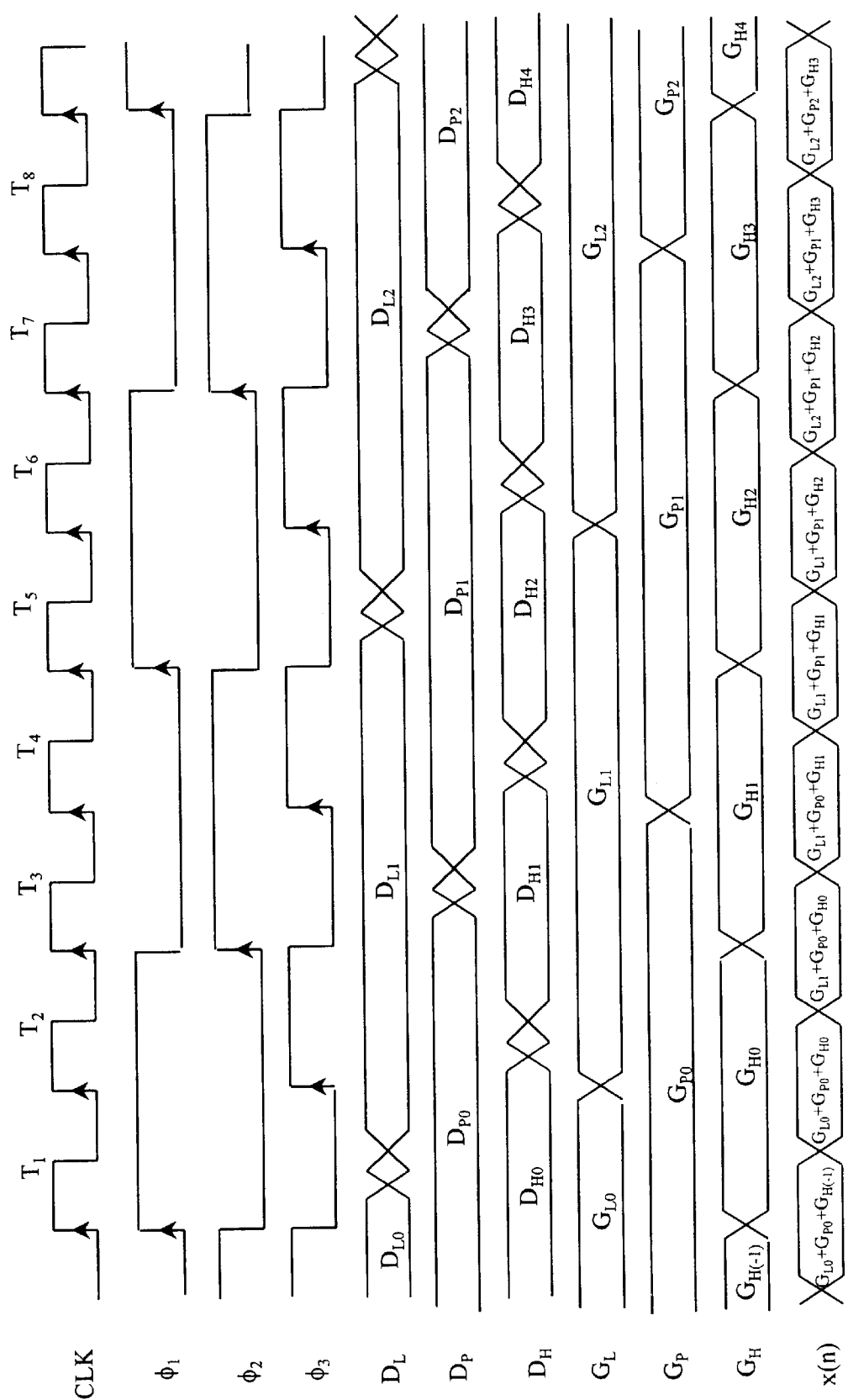
FIG. 8 is a timing diagram for the multi-resolution analog-to-digital converter of FIG. 7.

The operation of the multi-resolution A/D converter, which is analogous to that of the uniform analog-to-digital converter of FIG. 2, will now be described with reference also to FIG. 8. At the beginning of clock period T1 of main clock signal CLK, the rising edge of clock signal $\phi_1$ causes sample-and-hold circuit $SH_L$ to sample narrowband signal $X_L$. The sample is quantized by quantizer $Q_L$ to produce quantized sample $D_{L1}$ which is clocked into register $R_L$, as value $G_{L1}$, by the rising edge at the beginning of main clock period T2. The sample-and-hold circuit $SH_L$, holds the sample for one complete cycle of clock signal $\phi_1$, and the digitized value $G_{L1}$ remains in the register $R_L$ for a similar length of time, specifically until the end of period T5 of main clock signal CLK.

At the beginning of period T2 of clock signal CLK, the rising edge of clock signal $\phi_3$ causes sample-and-hold circuit $SH_H$ to sample high pass signal $X_H$ and the sample is quantized by quantizer $Q_H$ to produce digitized value $D_{H1}$. The corresponding digitized value $G_{H1}$ is clocked into register $R_H$ at the beginning of main clock period T3 of main clock signal CLK. In this case, digitized value $G_{H1}$ is stored in register $R_H$ for only two periods of main clock signal CLK.

At the beginning of period T3 of main clock signal CLK, the rising edge of clock signal $\phi_2$ causes sample-and-hold circuit $SH_P$ to sample handpass signal $X_P$. The resulting sample is quantized by quantizer $Q_P$ and clocked into register $R_P$ by the rising edge at the beginning of period T4 of main clock signal CLK. The corresponding digitized value $G_{P1}$ is stored in register $R_P$ for four periods of main clock signal CLK.

The summing device 12 (FIG. 9) sums the outputs of registers $R_L$, $R_P$ and $R_H$ at the beginning of each period of main clock signal CLK. Allowing for processing time, the result, $G_{L1}$ and $G_{P0}$ and $G_{H0}$ is available by the next falling edge of clock signal CLK, and is clocked into output register $R_{out}$. Values $G_{P0}$ and $G_{H0}$ are, of course, values previously obtained by a similar process.

The sequence is repeated for subsequent samples of the narrowband signals $X_L$, $X_P$ and $X_H$ to produce a series of values, $G_{L1}+G_{P0}+G_{H0}$, $G_{L1}+G_{P0}+G_{H1}$, $G_{L1}+G_{P1}+G_{H1}$, and so on as the digital output signal x(n) at the sampling $F_s$.

As before, in view of the continuous nature of the analog signal u(t) and the analysis filter bank characteristics of the A–D converter, x(n) is an accurate representation of input signal u(t), even though each of the individual sample-and-hold circuits $SH_L$, $SH_P$ and $SH_H$ does not necessarily sample at double the maximum frequency of the corresponding one of the narrowband signals $X_L$, $X_P$ and $X_H$.

Various modifications may be made to the above-described embodiments without departing from the scope of the present invention. Thus, in FIGS. 3, 6 and 8, sampling is carried out on the rising edges of the clock signals, but it would also be possible to carry out sampling on the falling or trailing edges, in which case suitable alternative components would be selected.

It should be noted that embodiments of the invention differ from time-interleaved D–A converters in that the inputs to the A/D converter units are subband signals of the wide-band continuous time input signal u(t). Another important difference in embodiments of this invention is that, unlike the time interleaved converters, the outputs are not time-multiplexed, but rather are summed.

Figure 10:
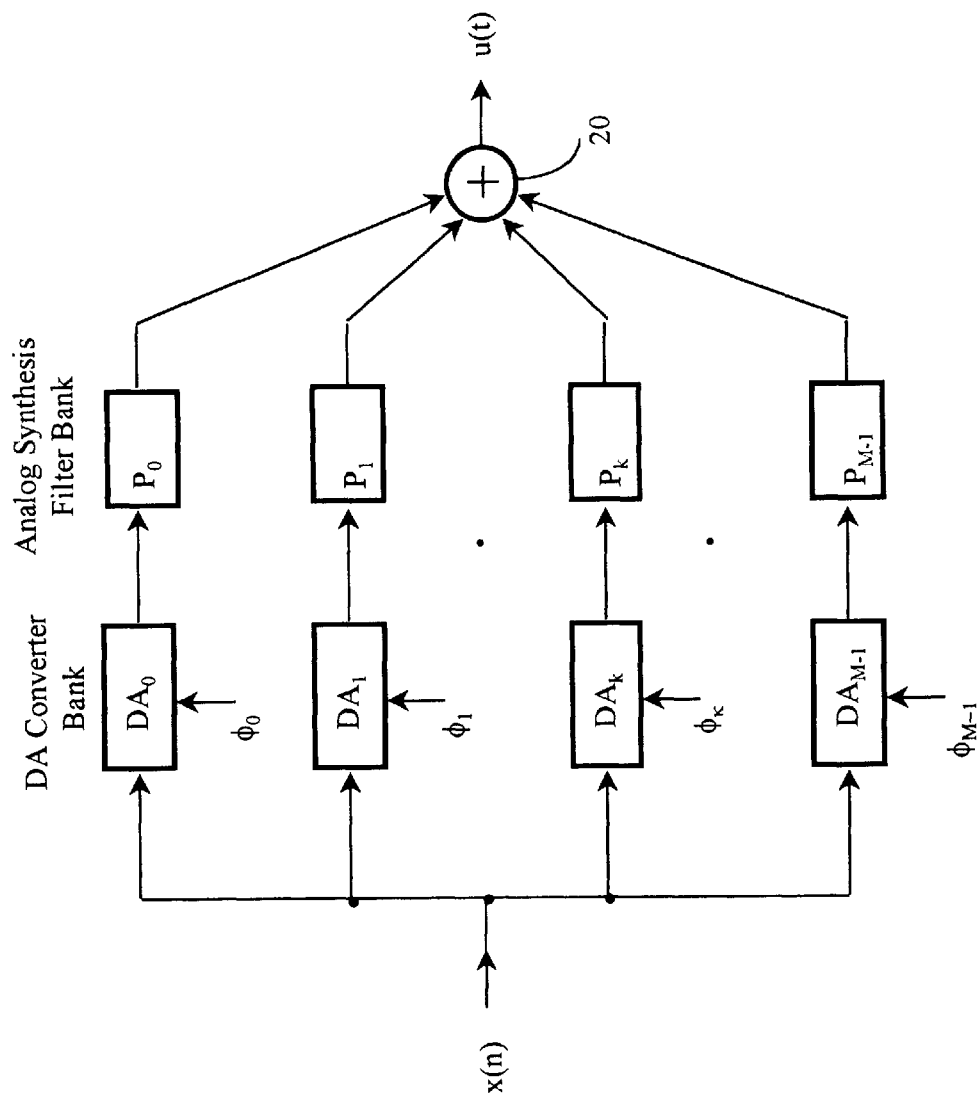
FIG. 10 is a schematic diagram of an M-band digital-to-analog converter according to a second aspect of the invention.

Referring now to FIG. 10, a digital-to-analog converter suitable for converting a high speed digital signal x(n) to an analog signal u(t) comprises a bank of lower speed D–A converter units $DA_0$, $DA_1$ . . . $DA_{M-1}$ having their inputs connected in common to receive the input digital signal x(n). The outputs of the D–A converters $DA_0$–$DA_{M-1}$ are applied to the inputs of a bank of narrowband filters $P_0$, $P_1$–$P_{M-1}$, respectively, the outputs of which are summed by analog summing device 20 to form the analog output signal u(t). The bank of narrowband filters $P_0$–$P_{M-1}$ and summing device 20 constitute an analog synthesis filter bank.

The bank of D–A converters $DA_0$–$DA_{M-1}$ are clocked by a corresponding plurality of clock signals $\phi_1$–$\phi_{M-1}$ which all have the same frequency but are offset in phase relative to each other, conveniently uniformly. As in the case of the A–D converter described hereinbefore, the phase offsets are such that each sampling point of the input signal x(n) coincides with a sampling point of one of the clock signals $\phi_1$–$\phi_{M-1}$.

Although embodiments of the invention have been described and illustrated in detail, it is to be clearly understood that the same are by way of illustration and example only and not to be taken by way of the limitation, the spirit and scope of the present invention being limited only by the appended claims.

What is claimed is:

1. An analog-to-digital converter for converting an analog input signal (u(t)) having a frequency up to a predetermined maximum frequency ($F_{max}$) to a digital output signal (x(n)) having a predetermined output sampling rate ($F_s$) equal to at least double the maximum frequency ($F_{max}$), the analog-to-digital converter comprising:

(i) a plurality of analog narrowband filters ($F_0$–$F_{M-1}$; $F_L$,$F_H$,$F_P$) for filtering the analog input signal (u(t)) to produce a corresponding plurality of narrowband signals ($X_0$–$X_{M-1}$; $X_L$,$X_H$,$X_P$), each narrowband filter having a passband, the sum of the gains of the narrowband filters at any frequency within an operating frequency band of the plurality of narrowband filters being substantially unity;

(ii) a corresponding plurality of sample-and-hold devices ($SH_0$–$SH_{M-1}$; $SH_L$,$SH_H$,$SH_P$) clocked by a plurality of clock signals ($\phi_0$–$\phi_{M-1}$), respectively, each of the plurality of clock signals having a frequency at least double the bandwidth of the corresponding narrowband filter; and (iii) a plurality of quantizers ($Q_0$–$Q_{M-1}$; $Q_L$,$Q_H$,$Q_P$) each connected to a respective one of the sample-and-hold devices ($SH_0$–$SH_{M-1}$; $SH_L$,$SH_H$,$SH_P$) and operable to provide a digitized value of each sample held by the corresponding sample-and-hold device;

(iv) sampling and summing means (12,$R_0$–$R_{M-1}$; 12₁,12₂, 14; 12,14₁,14₂; $R_L$,$R_H$,$R_P$) for sampling and summing the outputs of the quantizers to produce said digital output signal (x(n)), the sampling being carried out sequentially at the predetermined sampling rate (Fs) in response to an output clock signal (CLK), the frequencies and phase-relationships of the plurality of clock signals ($\phi_0$–$\phi_{M-1}$) being such that each sample point of the output clock signal coincides with a sample point of one of the plurality of clock signals.

2. An analog-to-digital converter according to claim 1, wherein the sampling-and-summing means (12, 12₁, 12₂ 14, 14₁, 14₂, $R_0$–$R_{M-1}$) comprises means ($R_{L-RH}$) for sampling the outputs of the quantizers at the predetermined rate ($F_s$) and means (12') for summing the samples from the sampling means ($R_0$–$R_{M-1}$).

3. An analog-to-digital converter according to claim 1, wherein the sampling-and-summing means (12, 12₁, 12₂ 14, 14₁, 14₂, $R_0$–$R_{M-1}$) comprises summing means (12₁–12₂) for summing digitized values from the plurality of quantizers and sampling means (14) for sampling the summed digitized values.

4. An analog-to-digital converter according to claim 1, wherein the plurality of narrowband filters all have the same bandwidth equal to one half of said predetermined output sampling rate (Fs) divided by the number (M) of said narrowband signals ($X_0$–$X_{M-1}$), and said plurality of clock signals ($\phi_0$–$\phi_{M-1}$) all have the same frequency and are uniformly phase-displaced relative to each other by a phase angle equal to one cycle of said same frequency divided by the number (M) of said plurality of clock signals.

5. An analog-to-digital converter according to claim 1, wherein the plurality of analog narrowband filters have non-uniform bandwidths for filtering the analog input signal (u(t)) to produce a corresponding plurality of narrowband signals ($X_0$–$X_{M-1}$) having different bandwidths.

\* \* \* \* \*